United States Patent [19]

van de Plassche et al.

[11] Patent Number: 4,897,656
[45] Date of Patent: Jan. 30, 1990

[54] COMPLEMENTARY VOLTAGE INTERPOLATION CIRCUIT WITH TRANSMISSION DELAY COMPENSATION

[75] Inventors: Rudy J. van de Plassche, Waalre, Netherlands; Peter G. Baltus, Sunnyvale, Calif.

[73] Assignee: North American Philips Corporation, Signetics Division, Sunnyvale, Calif.

[21] Appl. No.: 127,867

[22] Filed: Dec. 2, 1987

Related U.S. Application Data

[63] Continuation-in-part of Ser. No. 96,793, Sep. 14, 1987, Pat. No. 4,831,379, which is a continuation of Ser. No. 809,453, Dec. 16, 1985, abandoned.

[51] Int. Cl.[4] ............................................. H03M 1/36
[52] U.S. Cl. ..................... 341/159; 341/156; 341/169
[58] Field of Search ................ 341/156, 159, 162, 169

[56] References Cited

U.S. PATENT DOCUMENTS

| | | | |
|---|---|---|---|
| 4,058,806 | 11/1977 | Nadler | 341/159 |
| 4,270,118 | 5/1981 | Brokaw | 340/347 AD |
| 4,325,054 | 4/1982 | van de Plassche | 340/347 AD |
| 4,386,339 | 5/1983 | Henry et al. | 340/347 AD |
| 4,737,766 | 4/1988 | van de Plassche | 341/133 |

FOREIGN PATENT DOCUMENTS 2082411 3/1982 United Kingdom.

OTHER PUBLICATIONS

J. Peterson, "A Monolithic Video A/D Converter", *IEEE JSSC*, Dec. 1979, pp. 932–937.
R. van de Plassche et al., "A High-Speed 7 Bit A/D Converter," *IEEE JSSC*, Dec. 1979, pp. 938–943.
R. van de Grift et al., "A Monolithic 8-Bit Video A/D Converter," *IEEE JSSC*, Jun. 1984, pp. 374–378.

*Primary Examiner*—William M. Shoop, Jr.
*Assistant Examiner*—Gary J. Romano
*Attorney, Agent, or Firm*—R. Meetin; D. Treacy; T. Briody

[57] ABSTRACT

The invention centers around a system for interpolating between multiple pairs of complementary main signals to generate further pairs of complementary signals. An input circuit (10) supplies the main signals. The interpolation is a two-step operation. The first step is done with two strings (S and $S_N$) of impedance elements ($R_0$–$R_{N-1}$ and $R_{N0}$–$R_{NN-1}$). Each pair of main signals is supplied to a corresponding pair of nodes along the strings. Interpolated signals are taken from other pairs of corresponding nodes along the strings. In the second interpolation stage, a delay network (D) formed with additional impedance elements ($R_{D0}$–$R_{DN-1}$ and $R_{DN0}$–$R_{DNN-1}$) compensates for transmission delays through the impedance elements that make up the strings.

17 Claims, 7 Drawing Sheets

COMPLEMENTARY VOLTAGE INTERPOLATION CIRCUIT WITH TRANSMISSION DELAY COMPENSATION

CROSS REFERENCE TO RELATED APPLICATIONS

This is a continuation-in-part of U.S. Pat. application Ser. No. 096,793, filed Sept. 14, 1987, now U.S. Pat. No. 4,831,379 which is a continuation of U.S. Pat. application Ser. No. 809,453, filed Dec. 16, 1985, now abandoned.

FIELD OF USE

This invention relates to electronic circuits suitable for use in devices such as analog-to-digital (A/D) converters.

BACKGROUND ART

Important considerations in designing an A/D converter are speed, component count, and resolution. Flash converters provide the greatest speed. To convert an analog input voltage into an n-bit digital output code, a flash converter normally employs $2^n - 1$ comparators for comparing the input voltage with $2^n - 1$ corresponding reference voltages. See J. Peterson, "A Monolithic Video A/D Converter", *IEEE JSSC*, Dec. 1979, pp. 932-937.

The principal disadvantage of the flash converter is a high component count due to the large number of input comparators. Numerous schemes have been proposed to cut the number of comparators. For example, see U.S. Pat. Nos. 4,270,118 and 4,386,339. These schemes usually accept a loss in conversion speed as a compromise.

A "folding" system is one of the more promising techniques for reducing component count. In a folding A/D converter, a set of input amplifiers respond to the input voltage and a corresponding set of reference voltages in such a way as to generate one or more pairs of complementary waveforms having a repetitive rounded triangular shape as a function of the input voltage. A group of fine comparators convert these waveforms into a string of bits which are encoded into the least significant bits of the output code. The most significant bits are supplied from a group of coarse comparators which operate on the input voltage along a separate channel from the folding array. See R. van de Plassche et al., "A High-Speed 7 -Bit A/D Converter," *IEEE JSSC*, Dec. 1979, pp. 938-943. Also see R. van de Grift et al., "A Monolithic 8-Bit Video A/D Converter," *IEEE JSSC*, Jun. 1984, pp. 374-378.

Folding systems offer relatively good speed with low power dissipation. However, the inherent "rounding off" of the tips of the repetitive triangular waveforms must be taken into account to avoid loss in resolution. A simple technique that takes maximum advantage of the linear portions of these waveforms is highly desirable.

GENERAL DISCLOSURE OF THE INVENTION

The central feature of this invention is a system for interpolating between pairs of complementary signals that vary with a parameter to generate further pairs of complementary signals representing the parameter.

More particularly, an input circuit provides multiple pairs of substantially complementary main signals. The signals are typically generated in response to an analog input voltage in such a manner as to be linear (i.e., non-digital) in nature.

The interpolation is a two-step procedure. The first step is performed with two strings of a selected number of corresponding impedance elements, preferably resistors. A node is located between each pair of consecutive impedance elements in each string, at one end of one string, and at a corresponding end of the other string. The nodes fall into pairs of corresponding input nodes and pairs of corresponding interpolation nodes located in the same respective positions along the strings. The interpolation nodes are so distributed among the input nodes that at least one interpolation node lies between the two most distant input nodes in each string. Each pair of corresponding input nodes receives a different one of the pairs of main signals. The voltage at each interpolation node provides an interpolation of the voltages at the two nearest input nodes on opposite sides of that interpolation node.

An output circuit is invariably connected to the interpolation system to receive its output signals. The output circuit loads the interpolation system. This causes transmission delays to occur in the impedance elements. In very high-speed applications, these delays have a deleterious effect on the accuracy of the interpolation at the interpolation nodes. The problem is overcome in the second step of the interpolation with a delay network that compensates for the foregoing delays.

The delay network is formed with two or more additional pairs of impedance elements, again preferably resistors, that are used in supplying interpolation output signals at multiple pairs of corresponding interpolation output points. The number of output points equals the number of nodes. Each additional impedance pair is associated with a different pair of corresponding nodes and with a different pair of corresponding output points. The impedance elements in each additional pair are respectively coupled between the associated nodes, on one hand, and the associated output points, on the other hand. The remaining nodes (if any) are respectively coupled to the remaining output points.

Each impedance element in one string preferably has the same value as the corresponding impedance element in the other string. The values of the impedance elements in each additional pair are likewise preferably the same. Accordingly, the signals at each pair of corresponding interpolation output points are substantially complementary.

The values of the additional impedance elements are normally chosen such that the total transmission delays from the input nodes to the output points are largely the same for all the interpolation output signals. As a result, the output signals provide a highly accurate interpolation as a function of time.

While the present interpolation system has wide applicability, it is particularly useful in a folding-type A/D converter. The main signals are repetitive rounded triangular waveforms provided from a folding array in the converter. The output signals from the interpolation circuitry are provided to a group of comparators that generate a string of digital bits by comparing the voltages of each output signal pair.

The magnitudes of the voltage differences are not important in the comparisons. Only the "zero crossings"—i.e., the signs of the voltage differences —are material. The interpolation avoids difficulty involving the rounding off of the tips of the waveforms because their variation as a function of the input voltage is substantially linear in the vicinity of the zero crossings. Component count is thereby reduced without losing speed or accuracy.

Figure 1:
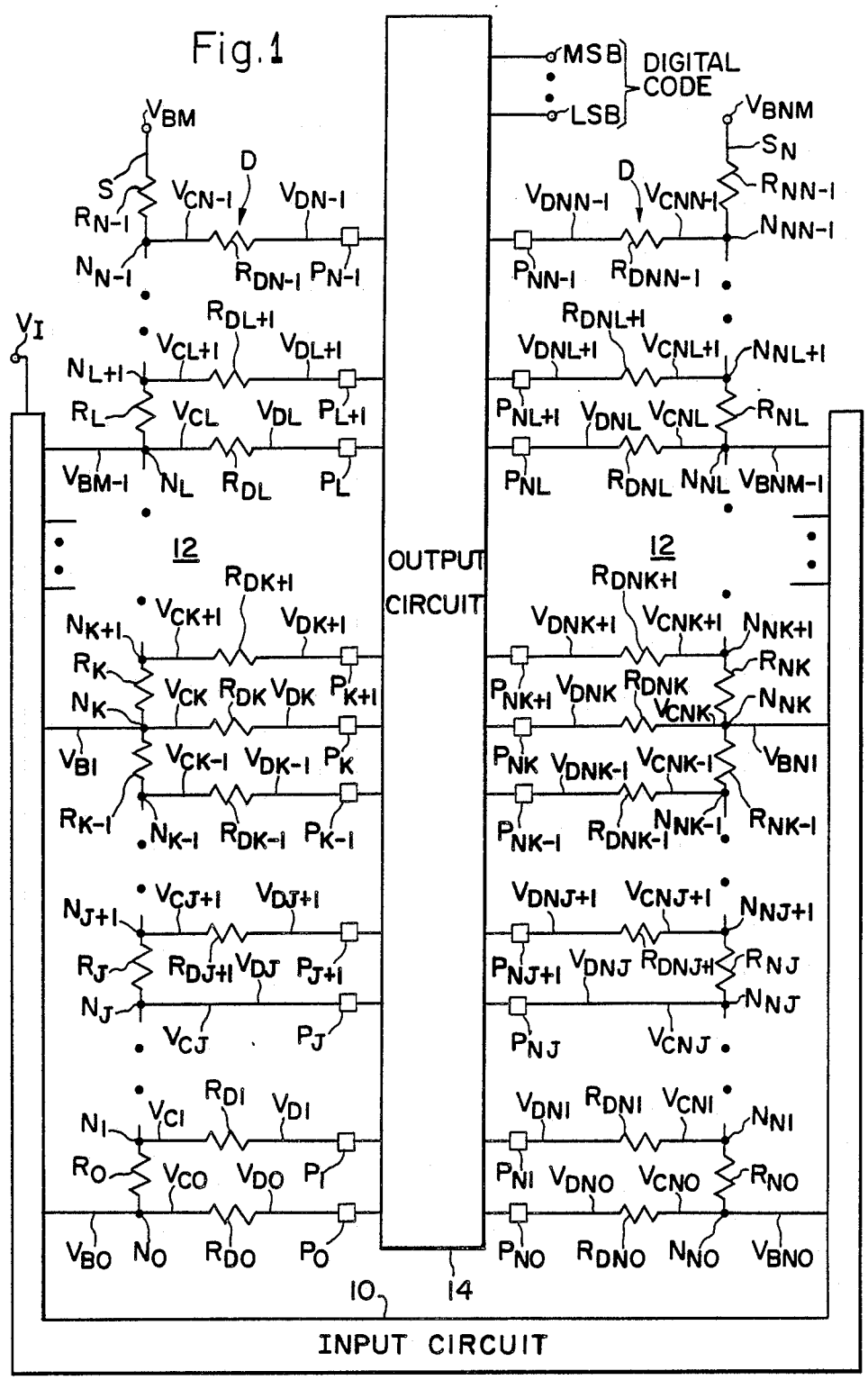
FIG. 1 is a circuit diagram of an embodiment of an interpolation system according to the invention.

Like reference signals are employed in the drawings and in the description of the preferred embodiments to represent the same or very similar item or items.

DESCRIPTION OF THE PREFERRED EMBODIMENTS

Referring to the drawings, FIG. 1 illustrates a circuit for interpolating between the voltage levels of $M+1$ main signals $V_{B0}, V_{B1}, \ldots V_{BM}$ and $M+1$ further main signals $V_{BN0}, V_{BN1}, \ldots V_{BNM}$. These $2(M+1)$ voltages are often referred to collectively as the "$V_B$" signals. M is at least 1. The signals of each pair of like-numbered $V_B$ signals are substantially complementary to each other. That is, each voltage $V_{BNj}$ is largely the electrical inverse of corresponding voltage $V_{Bj}$, where j runs from 0 to M.

An input circuit 10 provides voltage pair $V_{B0}$ and $V_{BN0}$ through pair $V_{BM-1}$ and $V_{BNM-1}$ in response to a parameter $V_I$ which is typically an analog input voltage. In one way or another, circuit 10 also generates voltages $V_{BM}$ and $V_{BNM}$. They may be distinct from the other $V_B$ signals. If there are repetitive transitions in the $V_B$ signals, $V_{BM}$ and $V_{BNM}$ may respectively be $V_{B0}$ and $V_{BN0}$ or vice versa to provide "interpolation around the corners".

Figure 2:
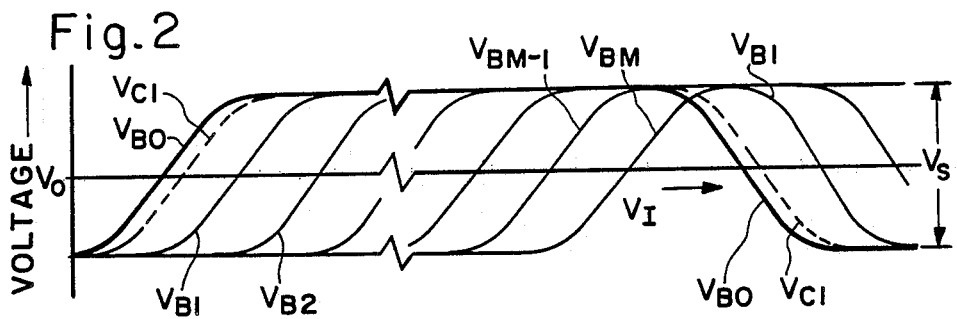
FIG. 2 is a graph of signals that can be interpolated by the system of FIG. 1.

The $V_B$ signals have voltage characteristics of the type generally indicated in FIG. 2. For simplicity, FIG. 2 only shows the waveforms for $V_{B0}$-$V_{BM}$. The $V_{B0}$ waveform is shown in thicker line. If the waveforms for $V_{BN0}$-$V_{BNM}$ as a function of $V_I$ were illustrated, they would respectively be the inverses of the waveforms for $V_{B0}$-$V_{BM}$.

The $V_B$ signals are spaced apart from one another as a function of $V_I$. They all vary across substantially the same voltage range whose magnitude is indicated as $V_S$. A consecutive pair of the $V_B$ signals consists of $V_{Bj-1}$ and $V_{Bj}$ or $V_{BNj-1}$ and $V_{BNj}$. The $V_B$ signals are numbered in such a way that the higher-numbered voltage $V_{Bj}$ or $V_{BNj}$ of each consecutive pair makes transitions between its extreme voltage levels at a greater $V_I$ value than the lower-numbered voltage $V_{Bj-1}$ or $V_{BNj-1}$.

At a given value of $V_I$, the voltage difference between any two consecutive $V_B$ signals is less than $V_S$ whenever at least one of them is changing with $V_I$. That is, the transition regions for two consecutive $V_B$ signals partially "overlap" as a function of $V_I$. In this manner, the $V_B$ signals are all "linear" signals. The zero-crossing point is at a voltage $V_O$ approximately half way between the minimum and maximum $V_B$ levels.

Returning to FIG. 1, an interpolation circuit 12 generates voltages that provide an interpolation between the voltages of each pair of consecutive $V_B$ signals. The results of the interpolation are provided from N pairs of corresponding interpolation output points $P_O$ and $P_{NO}$, $P_1$ and $P_{N1}$, ... $P_{N-1}$ and $P_{NN-1}$ to an output circuit 14. Circuit 12 performs the interpolation in two steps.

The first step is done with two resistor strings S and $S_N$. String S consists of N interpolation resistors $R_O, \ldots R_{N-1}$. String $S_N$ consists of N interpolation resistors $R_{NO}, \ldots R_{NN-1}$. Letting q be an integer running from 0 to $N-1$, corresponding resistors $R_q$ and $R_{Nq}$ have substantially the same resistance.

A node $N_q$ lies between each pair of consecutive resistors $R_{q-1}$ and $R_q$. A corresponding node $N_{Nq}$ similarly lies between each pair of consecutive resistors $R_{Nq-1}$ and $R_{Nq}$. In addition, corresponding nodes $N_O$ and $N_{NO}$ exist at the ends of strings S and $S_N$ where resistors $R_O$ and $R_{NO}$ are located. Some of the pairs of corresponding nodes are input nodes. At least one input node lies between the ends of each string S or $S_N$. The remainder of the nodes are interpolation nodes. At least one interpolation node lies between the two most distant input nodes along each string S or $S_N$.

Corresponding input signals $V_{Bj}$ and $V_{BNj}$ are respectively supplied to the particular input nodes located in the same relative position along strings S and $S_N$ that the pair $V_{Bj}$ and $V_{BNj}$ have in the sequence of $V_B$ signals. In particular, input nodes $N_O$ and $N_{NO}$ respectively receive voltages $V_{B0}$ and $V_{BN0}$. Letting K and L be selected integers in the range from 2 to N (where L is greater than K), FIG. 1 shows that the next input node pair $N_K$ and $N_{NK}$ receives the next pair $V_{B1}$ and $V_{BN1}$ and that input node pair $N_L$ and $N_{NL}$ receives pair $V_{BM-1}$ and $V_{BNM-1}$. Voltages $V_{BM}$ and $V_{BNM}$ are respectively supplied to terminals at the ends of strings S and $S_N$ where resistors $R_{N-1}$ and $R_{NN-1}$ are located. These terminals are additional input nodes if $V_{BM}$ and $V_{BNM}$ are distinct from the other $V_B$ signals.

Each pair of corresponding interpolation nodes provides a pair of corresponding interpolated signals that are substantially complementary to each other. For example, FIG. 1 indicates that interpolation node pairs $N_1$ and $N_{N1}, \ldots N_{K-1}$ and $N_{NK-1}$ respectively provide $K-1$ interpolated signal pairs $V_{C1}$ and $V_{CN1}, \ldots V_{CK-1}$ and $V_{CNK-1}$. The dashed line in FIG. 2 depicts a typical shape for $V_{C1}$.

For convenience in illustration, the "B" subscript in each of main signals $V_{B0}$-$V_{BM-1}$ and $V_{BN0}$-$V_{BNM-1}$ is changed to "C" after they pass through strings S and $S_N$. The string output signals therefore consist of N signal pairs $V_{C0}$ and $V_{CN0}$ through $V_{CN-1}$ and $V_{CNN-1}$. These are often referred to collectively as the "$V_C$" signals, of which N-M pairs are the interpolated signal pairs and the remaining M pairs are, in voltage, the same as the corresponding main $V_B$ signal pairs. Each voltage $V_{CNq}$ is the inverse of voltage $V_{Cq}$.

Output circuit 14 has input capacitances that load interpolation circuit 12. The currents passing through the interpolation resistors to form the N-M interpolated $V_C$ signal pairs thus encounter some RC impedance not experienced by the currents forming the main $V_B$ signal pairs. This causes the N-M interpolated signal pairs to be delayed slightly in time with respect to the main $V_B$ signal pairs.

Figure 3:
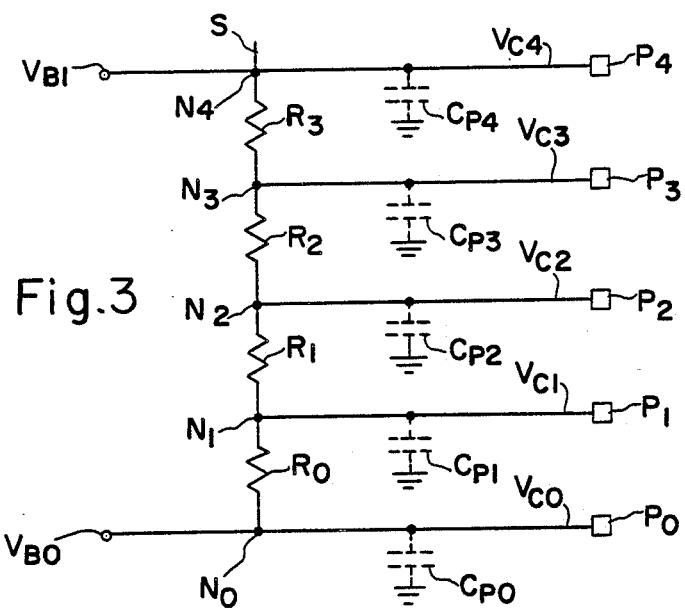
FIG. 3 is an expanded diagram of a portion of FIG. 1 without the compensation resistors.
Figure 4:
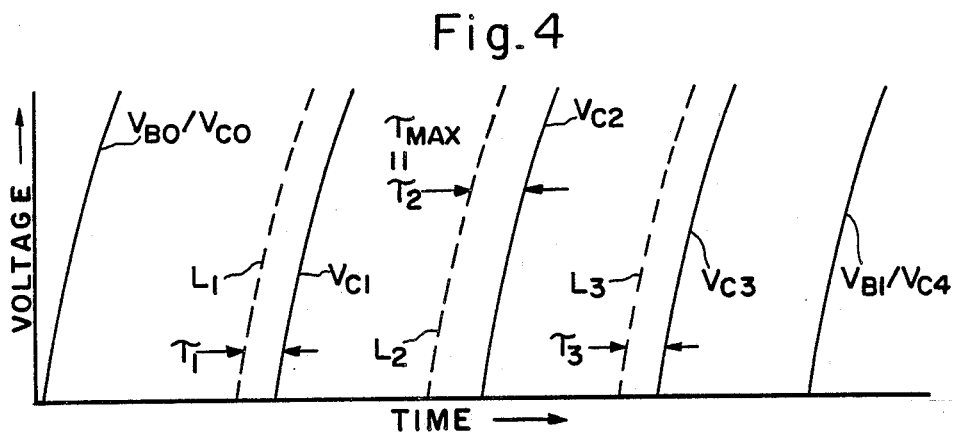
FIG. 4 is a time diagram illustrating the transmission delays arising in FIG. 3.

An understanding of the effect of these RC delays is facilitated with the assistance of FIGS. 3 and 4. FIG. 3 illustrates how a portion of string S would be connected to the interpolation output points if nothing were done to compensate for the delays. In particular, FIG. 3 shows the portion extending between the input nodes that receive voltages $V_{B0}$ and $V_{B1}$ for the case where K is 4. Capacitances $C_{P0}$, $C_{P1}$, ... $C_{P4}$ associated with output points $P_0$, $P_1$, ... $P_4$ represent the input capacitances of circuit 14. Capacitances $C_{P0}$–$C_{P4}$ are shown in dashed form because they are normally parasitic. However, they may be partially real capacitors. FIG. 4 shows how $V_{C0}$–$V_{C4}$ vary with time.

$V_{C1}$ is delayed by an amount $\tau_1$, with respect to the $V_B$ signals as a result of the current passage through resistors $R_0$–$R_3$. $V_{C2}$ is similarly delayed by an amount $\tau_2$. Assuming that neither resistors $R_0$–$R_3$ nor capacitances $C_{P0}$–$C_{P4}$ differ significantly in value, $\tau_2$ is the maximum transmission delay $\tau_{MAX}$ from the input nodes to the interpolation nodes. $V_{C3}$ experiences a transmission delay $\tau_3$ of similar magnitude to $\tau_1$. Delays $\tau_1$, $\tau_2$, and $\tau_3$ are illustrated in FIG. 4 with reference to curves $L_1$, $L_2$, and $L_3$ that represent how $V_{C1}$, $V_{C2}$, and $V_{C3}$ would appear if there were no delays.

The second step of the interpolation provides a delay compensation to avoid loss in accuracy that might otherwise be produced by the transmission delays from the input nodes to the interpolation nodes. Referring again to FIG. 1, the compensation is achieved with a delay network D that applies suitable further delays to the $V_C$ signals to produce 2N interpolation output signals $V_{D0}$, $V_{D1}$, ... $V_{DN-1}$ and $V_{DN0}$, $V_{DN1}$, ... $V_{DNN-1}$ that are delayed by largely equal amounts relative to the $V_B$ signals.

Delay network D consists of a set of additional pairs of resistors $R_{D0}$ and $R_{DN0}$, $R_{D1}$ and $R_{DN1}$, ... $R_{DN-1}$ and $R_{DNN-1}$. Each resistor $R_{Dq}$ is connected between node $N_q$ and output point $P_q$ from which signal $V_{Dq}$ is supplied. Each resistor $R_{DNq}$ is similarly connected between node $N_{Nq}$ and output point $P_{Nq}$ that supplies signal $V_{DNq}$. Corresponding compensation resistors $R_{Dq}$ and $R_{DNq}$ have substantially the same resistance. Consequently, corresponding signals $V_{Dq}$ and $V_{DNq}$ are substantially complementary.

There are certain values of q for which network D normally lacks compensation resistors. Output points $P_q$ and $P_{Nq}$ are connected directly to respective nodes $N_q$ and $N_{Nq}$ for these values of q. (This is equivalent to connections through zero-value resistors.) For example, FIG. 1 does not show any compensation resistors when q equals J, where J is a selected integer in the range from 1 to K. Compensation resistors are usually not employed for the q values at which the transmission delay from the input nodes to interpolation nodes $N_q$ and $N_{Nq}$ is very close to $\tau_{MAX}$. If M and N are both even integers, this results in M pairs of locations having no compensation resistors.

As a matter of convenience, the $V_C$ signals for the q values at which there are no compensation resistors are also labeled as $V_D$ signals in FIG. 1. $V_{DJ}$ and $V_{DNJ}$ are exemplary. Accordingly, N signal pairs $V_{D0}$ and $V_{DN0}$ through $V_{DN-1}$ and $V_{DNN-1}$ are supplied as the interpolation output signals from circuit 12. These signals are often referred to collectively as the "$V_D$" signals.

The values of each resistor $R_{Dq}$ or $R_{DNq}$ is preferably selected according to the relationship $$R_D = (\tau_{MAX} - \tau)/C_P \qquad (1)$$

where $R_D$ is the resistance, $\tau$ is the transmission delay from the input nodes to node $N_q$ or $N_{Nq}$, and $C_p$ is the capacitance at output point $P_q$ or $P_{Nq}$. $\tau$ is determined by suitable modeling. The same applies to $\tau_{MAX}$.

Figure 5:
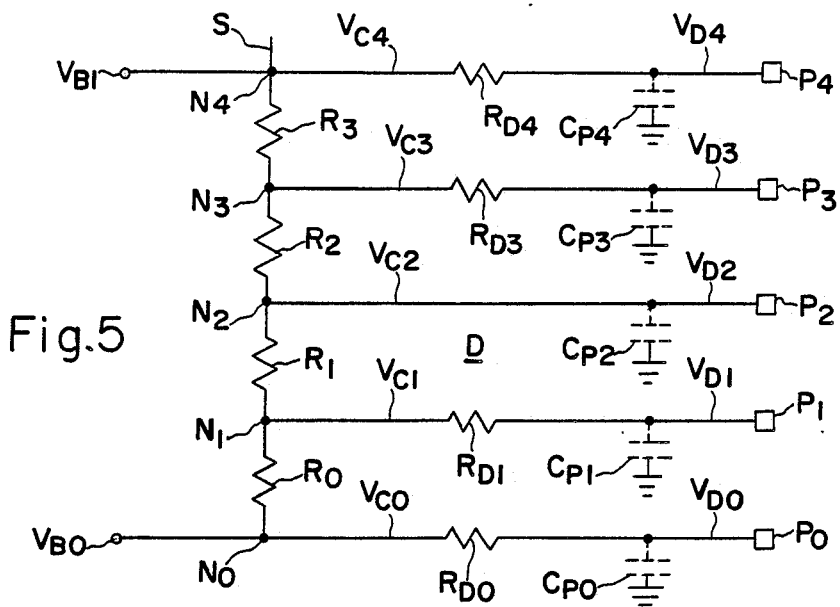
FIG. 5 is a diagram repeating FIG. 3 with the compensation resistors included.
Figure 6:
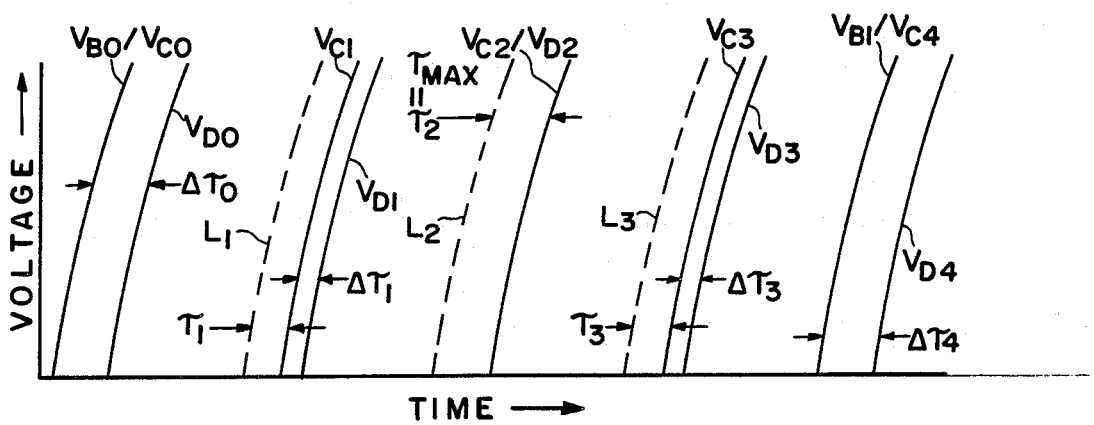
FIG. 6 is a time diagram illustrating the transmission delay compensation provided in FIG. 5.

The way in which the compensation works can be clearly seen by examining FIGS. 5 and 6. Akin to FIG. 3, FIG. 5 illustrates the compensated interpolation circuitry portion encompassing the input nodes that receive voltages $V_{B0}$ and $V_{B1}$ for the case in which K is 4. Compensation resistors $R_{D0}$, $R_{D1}$, $R_{D3}$, and $R_{D4}$ respectively cause $V_{D0}$, $V_{D1}$, $V_{D3}$, and $V_{D4}$ to be delayed relative to $V_{C0}$, $V_{C1}$, $V_{C3}$, and $V_{C4}$.

These further delays are indicated in FIG. 6. $V_{D0}$ and $V_{D4}$ are respectively delayed with respect to $V_{B0}/V_{C0}$ and $V_{B1}/V_{C4}$ by amounts $\Delta\tau_0$ and $\Delta\tau_4$ that equal (or nearly equal) $\tau_{MAX}$. $V_{D1}$ and $V_{D3}$ are respectively delayed by lesser amounts $\Delta\tau_1$ and $\Delta\tau_3$ with respect to $V_{C1}$ and $V_{C3}$ such that $\tau_1 + \Delta\tau_1$ and $\tau_3 + \Delta\tau_3$ both approximately equal $\tau_{MAX}$. $V_{D2}$ is the same as $V_{C2}$ which is already delayed by $\tau_{MAX}$. By using Eq. (1), the total transmission delays from the input nodes to the interpolation output points are largely the same for all the $V_D$ signals.

Output circuit 14 operates on the $V_D$ signals in some way. FIG. 1 shows, for example, that they are converted into a digital code.

Figure 7:
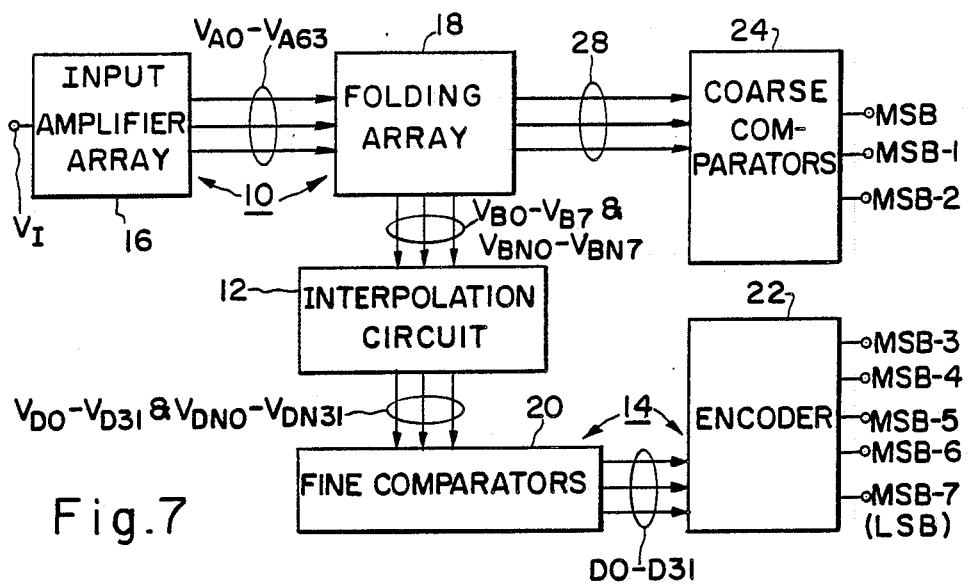
FIG. 7 is a general block diagram of a folding A/D converter using the interpolation system of FIG. 1.

FIG. 7 illustrates an application of the present interpolation system to an 8-bit A/D converter of the multiple folding type. Input circuit 10 of FIG. 1 here consists of an input amplifier array 16 and a folding array 18. Output circuit 14 of FIG. 1 consists of a group 20 of fine comparators and an encoder 22. The converter also has a group 24 of coarse comparators.

Figure 8:
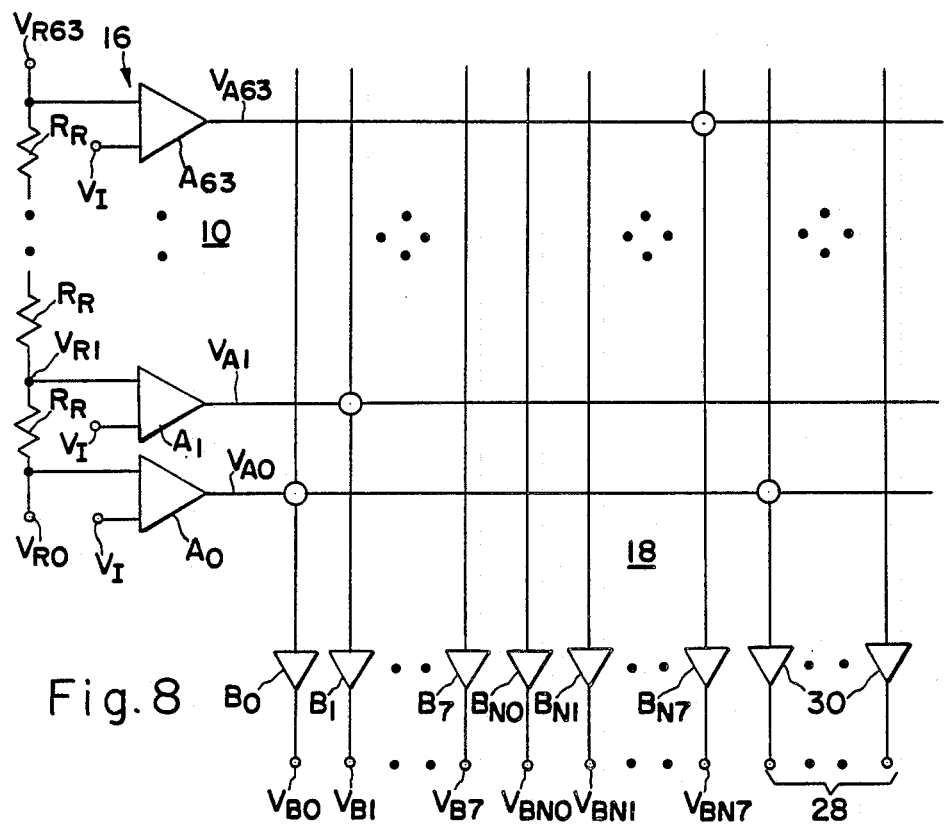
FIG. 8 is a circuit diagram of the input circuit of FIG. 7.

Turning to FIG. 8, it shows details of arrays 16 and 18. Amplifier array 16 contains 64 input amplifiers $A_0$–$A_{63}$ arranged in 8 rows by 8 columns. Letting i be an integer running from 0 to 63, each amplifier $A_i$ amplifies the difference between analog input voltage $V_I$ and a corresponding reference voltage $V_{Ri}$ to produce an amplified output voltage $V_{Ai}$. Voltages $V_{R0}$–$V_{R63}$ are supplied from a resistive divider consisting of 63 equal-value resistors $R_R$ connected between low and high reference voltages $V_{R0}$ and $V_{R63}$.

Figure 9:
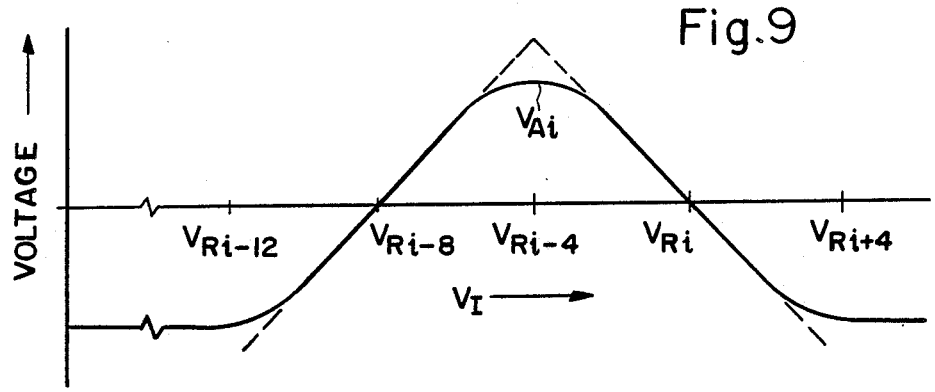
FIG. 9 is a graph of the output voltage from a typical input amplifier in FIG. 8.

FIG. 9 illustrates the general shape for typical voltage $V_{Ai}$ as a function of $V_I$. $V_{AI}$ would ideally have the triangular shape shown in dashed line. Due to practical amplifier characteristics, $V_{Ai}$ actually has the more rounded shape indicated in solid line.

Figure 10:
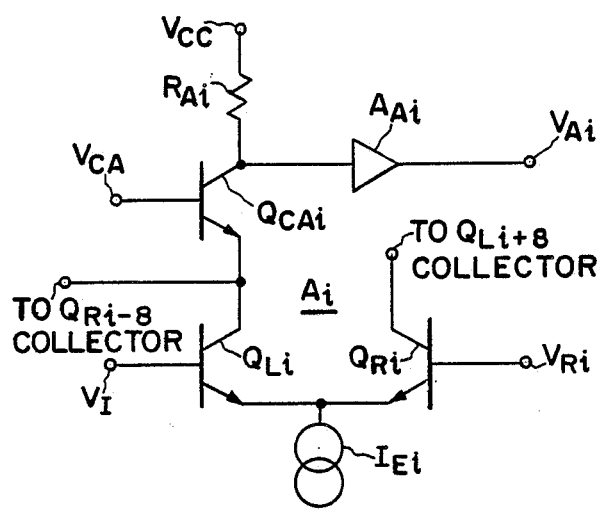
FIG. 10 is a circuit diagram of this amplifier.

The internal configuration for typical amplifier $A_i$ is depicted in FIG. 10. Voltages $V_I$ and $V_{Ri}$ are respectively supplied to the bases of identical NPN transistors $Q_{Li}$ and $Q_{Ri}$ whose emitters are connected to a current source $I_{Ei}$. The $Q_{Li}$ collector is connected to the emitter of an NPN cascode transistor $Q_{CAi}$ whose base receives a bias voltage $V_{CA}$. A load resistor $R_{Ai}$ is connected between a source of a high supply voltage $V_{CC}$ and the collector of transistor $Q_{CAi}$. Its collector is further connected to the input of a buffer amplifier $A_{Ai}$ whose output provides voltage $V_{Ai}$. Importantly, the collectors of transistors $Q_{Li}$ and $Q_{Ri}$ are respectively connected to the collectors of transistors $Q_{Ri-8}$ and $Q_{Li+8}$ in amplifiers $A_{i-8}$ and $A_{i+8}$.

Amplifier $A_i$ operates in a differential manner in conjunction with amplifier $A_{i-8}$. When $V_I$ equals $V_{Ri}$, the differential pair $Q_{Li}$ and $Q_{Ri}$ is balanced so that $V_{Ai}$ has a zero crossing. The differential pair $Q_{Li-8}$ and $Q_{Ri-8}$ in amplifier $A_{i-8}$ is balanced when $V_I$ equals $V_{Ri-8}$. Due to the collector coupling to transistor $Q_{Ri-8}$, $V_{Ai}$ has another zero crossing at that point. The result is that $V_{Ai}$ reaches a maximum voltage when $V_I$ equals $V_{Ri-4}$ and is constant at a minimum voltage when $V_I$ is less than $V_{Ri-12}$ or greater than $V_{Ri+4}$. The interaction with amplifier $A_{i+8}$ controls signal $V_{Ai+8}$ in the same way.

Folding array 18 electrically combines every sixteenth intermediate signal $V_{Ai}$ to produce 16 voltages $V_{B0}$-$V_{B7}$ and $V_{BN0}$-$V_{BN7}$. These signals are respectively supplied from the outputs of 16 buffer amplifiers $B_0$-$B_7$ and $B_{N0}$-$B_{N7}$ whose inputs are selectively coupled to the outputs of the desired $A_i$ amplifiers. The circles in FIG. 8 represent the couplings.

Figure 11:
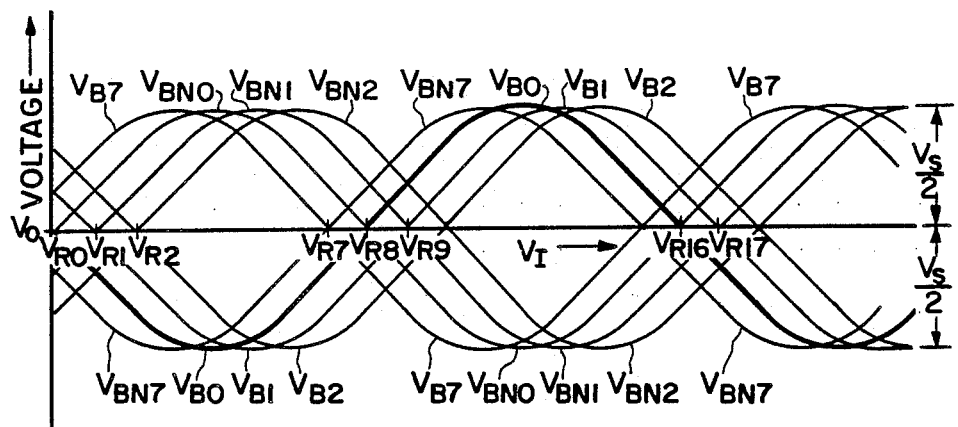
FIG. 11 is a graph of signals interpolated by the system of FIG. 12 which is a circuit diagram of the interpolation/output circuitry of FIG. 7.

FIG. 11 depicts part of the resulting $V_B$ signals as a function of $V_I$. Again, $V_{B0}$ is shown in thicker line. The remaining $V_B$ signals have the same shapes and spacing as those illustrated. Due to the rounding of the tips of the $V_{Ai}$ signals, each $V_B$ signal in FIG. 11 has a repetitive rounded triangular shape, almost that of a sine wave. The $V_B$ signals make repetitive transitions between their extreme levels as $V_I$ varies across the input range extending from $V_{R0}$ to $V_{R63}$.

Figure 12:
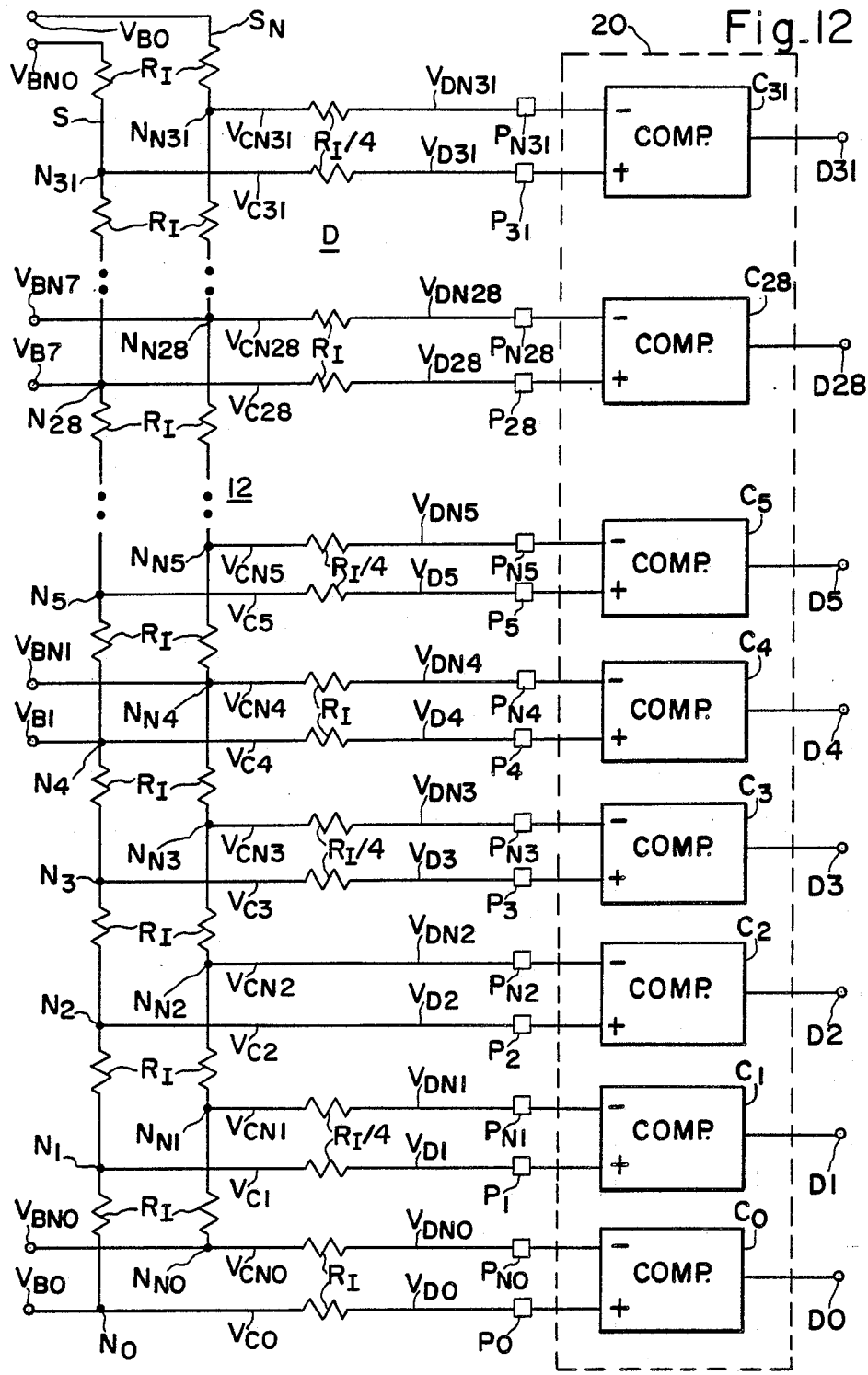

Moving to FIG. 12, it illustrates details for interpolation circuit 12 and fine comparators 20. The $V_{BM}$ and $V_{BNM}$ terminals in circuit 12 of FIG. 1 are respectively connected to nodes $N_{N0}$ and $N_0$ in FIG. 11. Consequently, $V_{BM}$ and $V_{BNM}$ in FIG. 1 respectively equal $V_{BN0}$ and $V_{B0}$ in FIG. 12. Resistor strings S and $S_N$ essentially become a ring of resistors. This enables the interpolation to extend over all the $V_B$ cycles as $V_I$ ranges from $V_{R0}$ to $V_{R63}$.

The resistors forming strings S and $S_N$ are labeled as $R_I$ in FIG. 12 and therefore have the same value. Four interpolation resistors $R_I$ lie between each pair of consecutive input nodes. In delay network D, the compensation resistors connected to the input nodes have the same value as the interpolation resistors. The compensation resistors connected to the interpolation nodes closest to the input nodes have a value equal to one fourth of the other resistors. The overall result is that circuit 12 interpolates by a factor of 4 between each consecutive pair of $V_B$ signals to generate 64 voltages $V_{D0}$-$V_{D31}$ and $V_{DN0}$-$V_{DN31}$.

Comparator group 20 consists of 32 master-slave flip-flops $C_0$-$C_{31}$. Each comparator $C_q$ compares complementary signals $V_{Dq}$ and $V_{DNq}$ to generate a digital bit $D_q$. The magnitudes of $V_{Dq}$ and $V_{DNq}$ are not important, only whether there is a zero crossing —i.e., whether their difference is positive or negative. Bit $D_q$ is a logical "1" (for example) if $V_{Dq}$ is greater than $V_{DNq}$, and vice versa.

Figure 13:
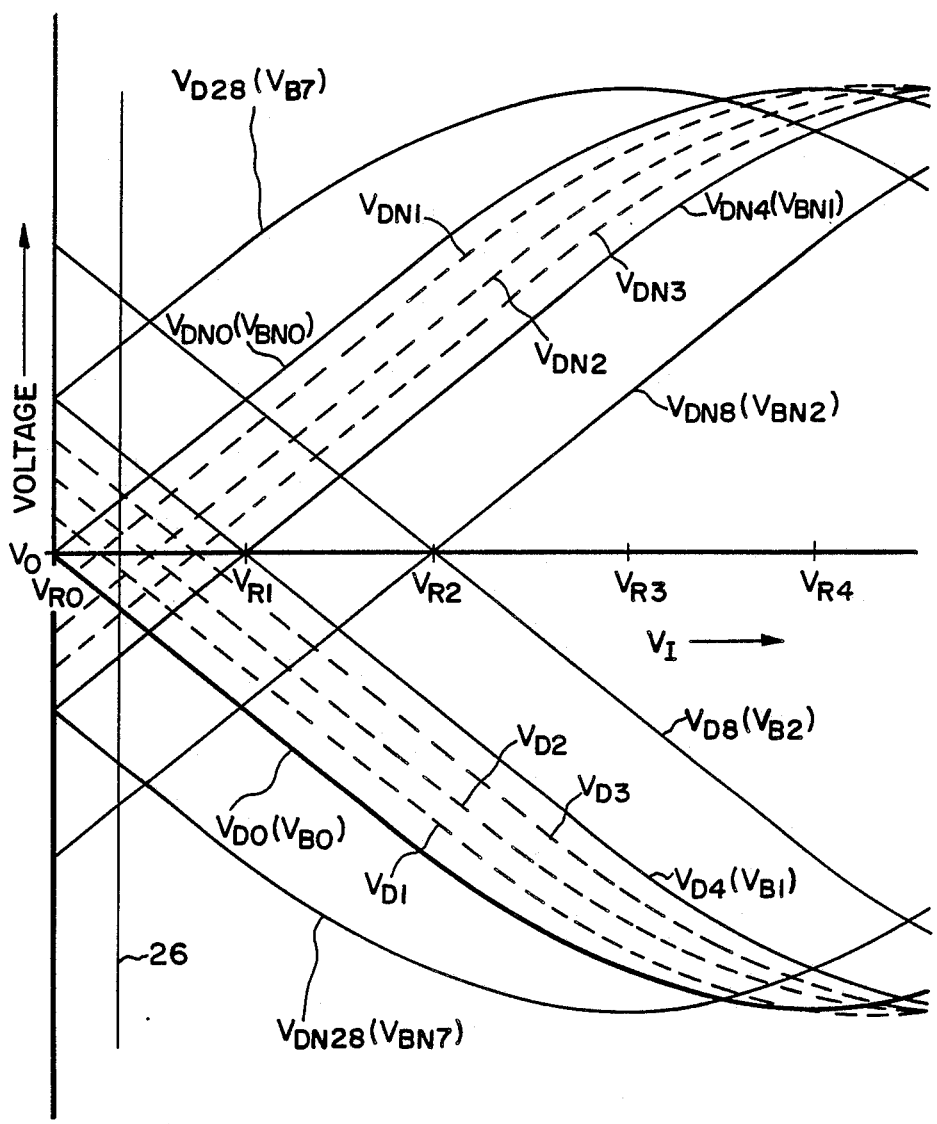
FIG. 13 is a graph of the signals produced by the interpolation.

FIG. 13 illustrates a sample of the interpolation as a function of $V_I$. $V_{D0}$ and $V_{D4}$ respectively equal $V_{B0}$ and $V_{B1}$ delayed by $\tau_{MAX}$ as explained above. $V_{D0}$ is shown in thicker line in FIG. 13. Because (a) the interpolation resistors are equal in value and (b) $V_{D1}$-$V_{D3}$ (derived from $V_{C1}$-$V_{C3}$) are also delayed by $\tau_{MAX}$ with respect to $V_{B0}$ and $V_{B1}$, voltages $V_{D1}$-$V_{D3}$ are equally spaced between voltages $V_{D0}$ and $V_{D4}$ at any instant in time. Voltages $V_{DN1}$, $V_{DN2}$, and $V_{DN3}$ are likewise equally spaced between voltages $V_{DN0}$ and $V_{DN4}$.

Complementary pair $V_{D0}$ and $V_{DN0}$ have a zero crossing when $V_I$ equals $V_{R0}$. Pair $V_{D4}$ and $V_{DN4}$ likewise have a zero crossing at $V_{R1}$. Consider what happens if $V_I$ has a value between $V_{R0}$ and $V_{R1}$ as, for example, represented by line 26 in FIG. 13. Comparators 20 provide bits D0, D1, D2, D3, and D4 as "00111". The bits resulting from the interpolated signals —i.e., the intermediate 3 bits "011" in this example —provide a finer digital conversion than that available solely from the $V_B$ signals.

The ability of the interpolation to provide accurate representation of input voltage $V_I$ is determined by the slopes of the $V_D$ signals in the vicinity of zero-crossing voltage $V_0$. The $V_B$ signals vary in a substantially linear manner near $V_0$. That is, their slopes are largely constant as a function of $V_I$ in the vicinity of $V_0$. The $V_B$ signals also have substantially the same slope near $V_0$. Since consecutive $V_B$ signals partially overlap one another as a function of $V_I$, the $V_D$ signals vary in a substantially linear manner near $V_0$ and have largely the same slope there.

The $V_D$ signals do vary in a non-linear manner near their extreme voltage levels. However, only the zero crossings are material to comparators 20. They provide accurate resolution if there is a sufficiently wide region around $V_0$ in which the $V_D$ signals have substantially the same, constant slope. The non-linear regions do not significantly affect the accuracy. By suitably choosing the amount that the $V_B$ signals overlap one another, the combination of circuits 12 and 20 provides high resolution without necessitating an excessive number of $V_B$ signals.

The minimum interpolation is a factor of 2. A factor of 8 normally yields good resolution.

Returning to FIG. 7, encoder 22 encodes the string of 32 bits D0-D31 into the five least significant bits MSB-3–MSB-7 of a digital output code. Encoder 22 is a suitably programmed read-only memory.

Coarse comparators 24 consist of three master-slave flip-flops that provide the three most significant bits MSB–MSB-2 of the digital output code in response to three pairs of substantially complementary further signals 28. The A/D converter generates signals 28 in largely the same manner as the $V_B$ signals. However, signals 28 do not have the repetitive folding shape of the $V_B$ signals. For convenience, FIGS. 7 and 8 show that voltages 28 are supplied from buffer amplifiers 30 in array 18.

Methods for manufacturing the various elements of the present invention are well known in the semiconductor art. The A/D converter is preferably fabricated in monolithic integrated circuit form using oxide isolation to separate active semiconductor regions.

The present A/D converter occupies significantly less chip area than an otherwise comparable 8-bit flash converter. While circuits 12, 18, and 20 take about the same area as the encoding circuitry of the flash converter, the number of transistors in a comparator is several times that in each amplifier $A_i$. Consequently, the chip area is typically reduced by a factor of around three. The instant converter also has low input capacitance and low power consumption.

While the invention has been described with reference to particular embodiments, this description is solely for the purpose of illustration and is not to be construed as limiting the scope of the invention claimed below. For example, the interpolation system may be loaded by capacitances existing between the inverting and non-inverting inputs of the fine comparators, in addition to the capacitances between ground and the comparator inputs. This situation is handled by taking advantage of the fact that a capacitance between the inputs of a comparator is electrically equivalent to a pair of double-value grounded capacitances. Capacitance $C_p$ in Eq. (1) then equals the actual grounded capacitance at the comparator input plus a capacitance equal to twice the value of the capacitance between that input and the other input. Various changes, modifications, and applications may thus be made by those skilled in the art without departing from the true scope and spirit of the invention as defined in the appended claims.

We claim:

1. An electronic circuit having input means responsive to an input parameter for providing multiple pairs of substantially complementary main signals, each of which varies with the input parameter, characterized by interpolation means comprising:

two strings of a selected number of impedance elements in which (a) a node is located between each pair of consecutive impedance elements in each string, at one end of one string, and at a corresponding end of the other string, (b) the pairs of nodes located at like positions along the strings are divided into pairs of corresponding input nodes and pairs of corresponding interpolation nodes, whereby at least one of the input nodes lies between the ends of each string, (c) at least one of the interpolation nodes is located between the two most distant input nodes in each string, and (d) each pair of corresponding input nodes receives a different one of the pairs of main signals; and delay means for supplying interpolation output signals at multiple pairs of corresponding interpolation output points, the number of output points being equal to the number of nodes, the delay means comprising at least two additional pairs of impedance elements for which (a) each additional pair is associated with a different pair of corresponding nodes and with a different pair of corresponding output points, (b) the impedance elements in each additional pair are coupled between the associated nodes, respectively, and the associated output points, respectively, and (c) the remaining nodes, if any, are respectively coupled to the remaining output points.

2. A circuit as in claim 1 characterized in that: each impedance element in one of the strings has largely the same impedance as the like-positioned impedance element in the other string; and the impedance elements in each additional pair have largely the same impedance, the signals of each pair of corresponding interpolation output signals being substantially complementary to each other.

3. A circuit as in claim 2 characterized in that there are transmission delays from the input nodes to the output points and that these delays are largely the same for all the interpolation output signals.

4. A circuit as in claim 2 characterized in that each impedance element is a resistor.

5. A circuit as in claim 4 characterized in that each resistor in the delay means has a resistance $R_D$ selected according to:

$$R_D = (\tau_{MAX} - \tau)/C_P$$

where $\tau_{MAX}$ is the maximum transmission delay from the input nodes to the interpolation nodes, $\tau$ is the transmission delay from the input nodes to the particular node associated with and coupled to that resistor, and $C_P$ is the capacitance at the similarly associated output point.

6. A circuit as in claim 5 characterized in that the additional pairs of resistors in the delay means are provided for all the nodes except those for which $\tau$ substantially equals $\tau_{MAX}$.

7. A circuit as in claim 6 characterized by output means coupled to the output points for converting the interpolation output signals into a digital code.

8. A circuit as in claim 2 characterized by means connecting the input means to the strings for providing them with the main signals.

9. A circuit as in claim 2 characterized in that the aforementioned end of each string is connected either to the other end of that string or to the other end of the other string.

10. A circuit as in claim 1, 2, or 3 characterized in that the input means comprises: means for providing a plurality of reference voltages spaced across an input voltage range; means responsive to an input voltage that varies across the input voltage range for generating a plurality of intermediate voltages respectively corresponding to the reference voltages and cumulatively representative of the input voltage, each intermediate voltage having a waveform that as a function of the input voltage, is of a rounded triangular shape with an extreme value occurring when the input voltage is slightly less than the corresponding reference voltage; and means for combining selected ones of the intermediate voltages to produce the main signals.

11. A circuit as in claim 10 further including output means coupled to the output points for converting the interpolation output signals into a digital code.

12. An electronic circuit for converting an analog input voltage which varies across an input voltage range into a digital code consisting of a set of most significant bits and a set of least significant bits, there being: means for supplying the most significant bits; means for providing a plurality of reference voltages spaced across the input voltage range; means responsive to the input and reference voltages for generating multiple pairs of substantially complementary main signals, each having a voltage waveform that as a function of the input voltage, is of a repetitive rounded triangular shape; and means for operating on the main signals to produce the least significant bits; characterized in that means for operating comprises:

two strings of a selected number of impedance elements in which (a) a node is located between each pair of consecutive impedance elements in each string, at one end of one string, and at a corresponding end of the other string, (b) the pairs of nodes located at like positions along the strings are divided into pairs of corresponding input nodes and pairs of corresponding interpolation nodes, whereby at least one of the input nodes lies between the ends of each string, (c) at least one of the interpolation nodes is located between the two most distant input nodes in each string, and (d) each pair of corresponding input nodes receives a different one of the pairs of main signals; and delay means for supplying interpolation output signals at multiple pairs of corresponding interpolation output points, the number of output points being equal to the number of nodes, the delay means comprising at least two additional pairs of impedance elements for which (a) each additional pair is associated with a different pair of corresponding nodes and with a different pair of corresponding output points, (b) the impedance elements in each additional pair are coupled between the associated nodes, respectively, and the associated output points, respectively, and (c) the remaining nodes, if any, are respectively coupled to the remaining output points; and means coupled to the output points for converting the interpolation output signals into the least significant bits.

13. A circuit as in claim 12 characterized in that: each impedance element in one of the strings has largely the same impedance as the like-positioned impedance element in the other string; and the impedance elements in each additional pair have largely the same impedance, the signals of each pair of corresponding interpolation output signals being substantially complementary to each other.

14. A circuit as in claim 13 characterized in that there are transmission delays from the input nodes to the additional nodes and that these delays are largely the same for all the interpolation output signals.

15. A circuit as in claim 12 characterized in that each impedance element is a resistor.

16. A circuit as in claim 13 characterized in that each resistor in the delay means has a resistance $R_D$ selected according to:

$$R_D = (\tau_{MAX} - \tau)/C_P$$

where $\tau_{MAX}$ is the maximum transmission delay from the input nodes to the interpolation nodes, $\tau$ is the transmission delay from the input nodes to the particular node associated with and coupled to that resistor, and $C_P$ is the capacitance at the similarly associated output point.

17. A circuit as in claim 16 characterized in that the additional pairs of resistors are provided for all the nodes except those for which $\tau$ substantially equals $\tau_{MAX}$.